United States Patent [19]

Resneau et al.

[11] 4,408,219
[45] Oct. 4, 1983

[54] DEVICE FOR CONNECTING IN PARALLEL POWER TRANSISTORS IN VERY HIGH FREQUENCY

[75] Inventors: Jean C. Resneau; Marius Cirio; Jean Doyen, all of Paris, France

[73] Assignee: Thomson-CSF, Paris, France

[21] Appl. No.: 208,006

[22] Filed: Nov. 18, 1980

[30] Foreign Application Priority Data

Nov. 21, 1979 [FR] France .................. 79 28692

[51] Int. Cl.³ ........................................... H01L 39/02
[52] U.S. Cl. ........................................ 357/80; 357/75
[58] Field of Search .............................. 357/80, 75, 74

[56] References Cited
U.S. PATENT DOCUMENTS 4,296,456 10/1981 Reid .................................... 357/80 X Primary Examiner—Martin H. Edlow
Attorney, Agent, or Firm—Oblon, Fisher, Spivak, McClelland & Maier

[57] ABSTRACT

A device for connecting in parallel high power transistors in very high frequency having a first plate serving as an electrical and thermal earth plane and a second electrically insulating plate supporting two metallized zones for connection respectively to the system of first parallel-connected electrodes of a transistor and a system of second parallel-connected electrodes of the same transistors, the third electrodes being connected to earth. The transistors, in the form of monolithic systems, are respectively placed on electrically insulating and thermally conductive plates welded to the first zone, while connecting the first electrodes to a first series of terminals and connecting the second electrodes to a second series of terminals. The metallized zones are respectively connected to the terminals of each series by conductors passing through the second electrically insulating plate, the transistors being inserted between the first and second plates.

6 Claims, 3 Drawing Figures

DEVICE FOR CONNECTING IN PARALLEL POWER TRANSISTORS IN VERY HIGH FREQUENCY

BACKGROUND OF THE INVENTION

1. Field of the Invention

The invention relates to a device for connecting in parallel transistors in very high frequencies and particularly those which are to be placed between an input line and and an output line arranged on two parallel conductive planes. The invention also relates to the use of such a device in a very high frequency and high power amplifier, for example 500 watts.

2. Description of the Prior Art

At very high frequencies, particularly above 1 gigahertz, transistors are frequently placed in load circuits insulating the collectors from earth. It is therefore necessary to insulate from earth the rear face of the transistor substrate (that opposite the face carrying the base and emitter electrodes).

In the case of a high power transistor, particularly above a few dozen watts, it becomes imperative to dissipate the heat given off during the operation of the transistor. A beryllium oxide plate is then placed between the earth and the rear face of the transistor substrate. Beryllium oxide simultaneously has a good insulating capacity, a good thermal conductivity and a thermal expansion coefficient which is relatively close to that of silicon. However, limitations are placed in this direction by the size of the useable beryllium oxide plates in the case of very high power transistors which in practice are constituted by a plurality of parallel-connected monolithic transistors (chips). Thus, during the welding of the chip to its support there is a risk of cracks or faults due to the very considerable difference in the thermal expansion coefficient between the beryllium oxide and the copper of the support. Moreover, in the case where several transistor chips are used with the same number of different substrates placed on the same beryllium oxide plate difficulties are encountered in the collective welding thereof and for making the parallel connections, without risking undesirable mixtures.

The invention makes it possible to solve most of these difficulties.

SUMMARY OF THE INVENTION

The device according to the invention is of the type comprising a first plate serving as an electrical and thermal earth plane formed, for example, by the metal base of a case and a second electrically insulating and thermally conductive plate supporting two metallized zones which are to be respectively connected to a system of first parallel-connected electrodes belonging to the different transistors and a system of second parallel-connected electrodes belonging to the same transistors, the third electrode of each of these transistors being connected to earth.

The present invention is mainly characterized in that:
(a) as the transistors are in the form of 2n (n being an integer equal to or higher than one) monolithic systems, the latter are respectively placed on 2n electrically insulating and thermally conductive wafers welded to the first plate by connecting the first electrodes to a first series of terminals (for example occupying a central position) and connecting the second electrodes to a second series of terminals (for example occupying lateral positions;
(b) the metallized zones are respectively connected to the terminals of each series by conductors traversing the second plate, the transistors being inserted between the first and the second plates.

BRIEF DESCRIPTION OF THE DRAWINGS

The invention is described in greater detail hereinafter relative to non-limitative embodiments and the attached drawings, wherein there is show.

DETAILED DESCRIPTION OF THE PREFERRED EMBODIMENTS

In the construction described hereinafter and illustrated by FIGS. 1 to 3 four power bipolar transistors (each approximately 100 watts) are placed in the manner indicated in FIG. 1 in the base of a rectangular case 10 made from gilded copper.

Figure 1:
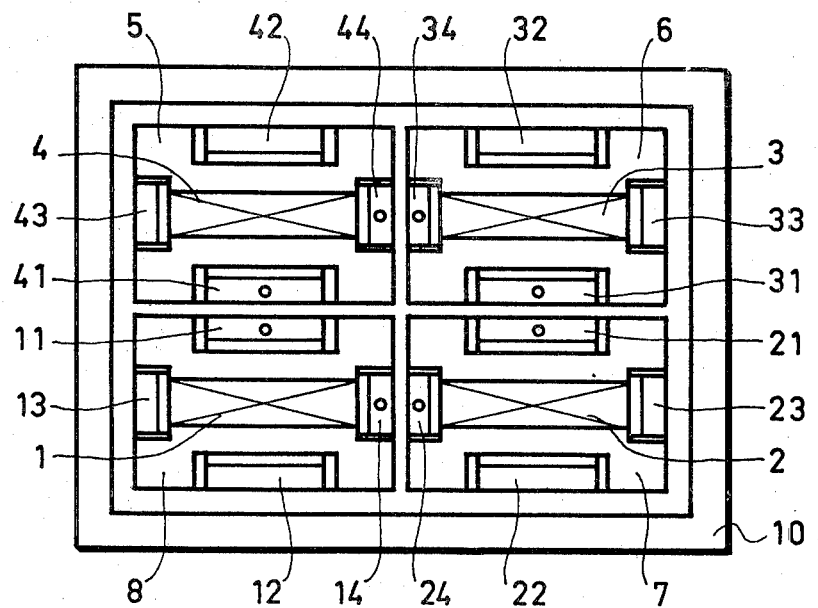
FIG. 1 a plan view diagrammatically showing the organization of the power transistors, together with their connection means and their positioning in a case base according to one embodiment of the invention.
Figure 2:
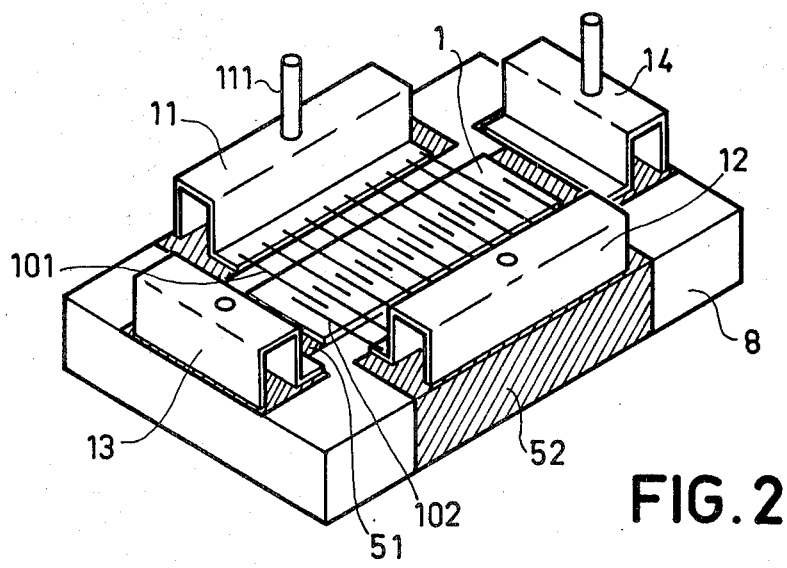
FIG. 2 a perspective view of one of the transistors in the aforementioned embodiment.

These transistors, which are for example made from silicon, are monolithic and are shown symbolically in FIG. 1, whereas in FIG. 2 it is possible to see two connecting conductive connecting combs connected to the base terminal 11 and emitter terminal 12. This constitutes a very simplified representation. Each silicon chip carries:

(a) one or more rows of elementary transistors having in each case a base and an emitter in the form of interdigitated structures (not shown), whose connections are in the form of metal coatings deposited on the silica covering the silicon and converging towards a certain number of common points for the connection of overhead wires;

(b) output leads of overhead connections such as base wire 101 and emitter wire 102 towards terminals 11 and 12 (FIG. 2) and, although not shown in FIG. 1, towards the identical terminals 21 and 22 for transistor 2, 31 and 32 for transistor 3, etc.

These terminals, like the silicon chips, are welded to beryllium oxide wafers 5 to 8, which are themselves welded to the bottom of case 10.

Moreover, the transistor collector is in a region of the substrate in a phase with the rear face of the latter. The actual substrate is welded at the rear face to a metallized zone 51 of wafer 8. This zone has a surface which projects beyond the chip and is extended beneath the terminals 13 and 14, either of which can serve as the collector terminal. The metallized zone 51 is visible in FIG. 2 between chip 1 and terminals 13 and 14. The terminal used for the electrical connection with the circuit outside the transistor is, for example, terminal 14, which, as shown in FIG. 1, occupies a more central position in the case than terminal 13.

Finally terminal 12 is connected to the bottom of the box via a metallized zone 52 deposited on the edge of the wafer and overlapping the two large faces thereof.

The four terminals 11 to 14 of one and the same transistor are for example in the form of gilded copper sheets bent in U-shaped manner and welded to wafer 5.

Terminals 11 and 14 support cylindrical projections (such as 111 for terminal 11) whose axes are perpendicular to the base of the case. Terminals 12 and 13 have no such projections.

The projections of terminals 14, 24, 34 and 44 occupy a more central position than the projections of terminals 11, 21, 31 and 41.

Figure 3:
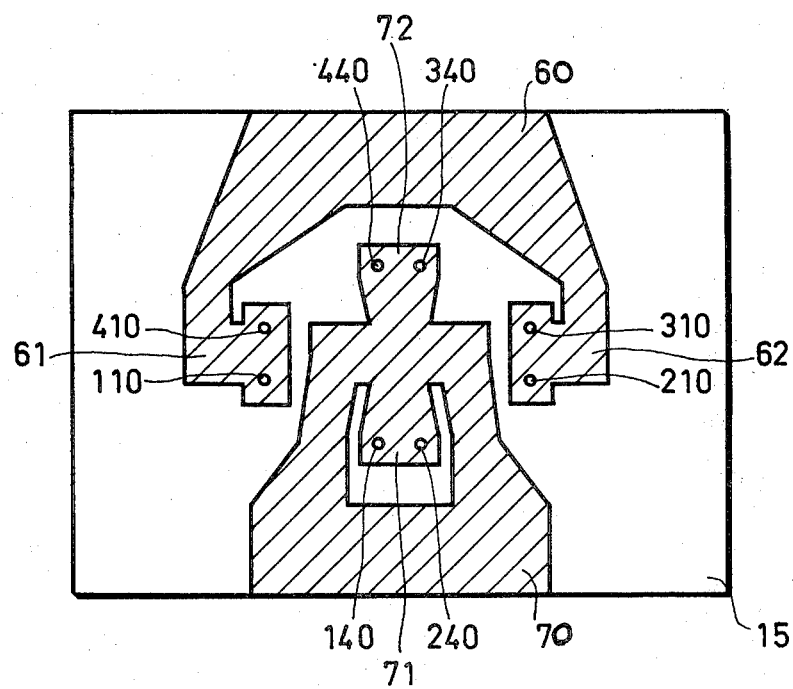
FIG. 3 a plan view of the second plate carrying metallized zones of a special configuration of the aforementioned embodiment.

FIG. 3 shows a ceramic material plate 15 which serves as a cover for case 10 and as an electrical connecting surface for the input and output circuits of an amplifier, whose active component is constituted by the system of four transistors. The outgoing and/or incoming zones of these circuits are materialized on the upper face of the case cover, for example by metal conductors 60 and 70, which are for example gilded nickel or copper strips welded to plate 15.

Plate 15 has eight perforations which traverse the ceramic material and the corresponding metal zone. These perforations have been given reference numerals 110, 210, 310 and 410 to indicate the base projection terminals which pass through them and reference numerals 140, 240, 340 and 440 to indicate the collector projection terminals which pass through them on closing the case using plate 15. On the periphery of the plate face opposite to conductors 60 and 70 there is provided a metal coating for welding to the border of case 10 in order to seal the latter.

It is pointed out that the conductors 60 and 70 have complementary shapes which are intended to group the projection into two systems of four. The perforations 110 to 410 are grouped in pairs on two metal zones 61 and 62 symmetrical with respect to the centre of plate 15 and enclosing conductor 70 or two zones 71 and 72 grouping the perforations 140 to 440 in pairs. This leads to the optimum reduction of stray inductances in the case of a group of four transistors.

The invention is applicable to very high frequency, power amplifiers using 2n transistors. It is merely necessary to arrange the transistors in n columns disposed on the first plate on individual wafers provided with terminals and projections identical to those of the device with four transistors. The metal zones are arranged in the same way as in FIG. 3.

The invention is applicable to field-effect transistors, wherein source, gate and drain electrodes are respectively substituted for emitter, base and collector electrodes.

What is claimed is:
1. A device for connecting in parallel 2n transistor chips (1, 2, 3, 4) for operating at high power and very high frequency, said device comprising:
   a lower thermally and electrically conducting plate (10),
   2n wafers (5, 6, 7, 8) electrically insulating and thermally conductive, welded to said conducting plate (10), arranged in n columns, and on each of which one of said 2n chips is placed,
   an upper electrically insulating plate (15) supporting two metallized zones (60, 70) on its outer face, said insulating plate facing said conducting plate, and
   wherein each wafer is provided with at least three terminals (11, 12, 13, 14) respectively connected with each electrode of said one of said 2n transistor chips, one of said terminals (12) being connected with said conducting plate and two of said terminals (11, 14) supporting conducting projections (111) traversing said upper insulating plate and each of said two terminals respectively contacting one of said metallized zones (60, 70).

2. A device according to claim 1, wherein said transistors are located in a case, whose base is constituted by said conducting plate and whose cover is constituted by said insulating plate.

3. A device according to claim 1, wherein said two terminals correspond to the base and the collector of a bipolar transistor.

4. A device according to claim 1, wherein said two terminals correspond to the gate and the drain of a field-effect transistor.

5. A device according to claim 1, wherein said transistor chips are made from silicon, the wafers from beryllium oxide and the insulating plate from a ceramic material covered with metal zones.

6. A device according to claim 2, wherein said insulating plate is provided with a metal coating on its edges so that it can be welded to the border of said case, thereby ensuring the sealing of said case.

* * * * *